United States Patent
Sterkel

(10) Patent No.: US 11,258,855 B2
(45) Date of Patent: Feb. 22, 2022

(54) SYSTEM AND METHOD FOR ANALYZING AND MONITORING SMART METER NETWORK COMMUNICATIONS

(71) Applicant: Florida Power and Light Company, Juno Beach, FL (US)

(72) Inventor: Gary Wayne Sterkel, Plantation, FL (US)

(73) Assignee: Florida Power & Light Company, Juno Beach, FL (US)

(*) Notice: Subject to any disclaimer, the term of this patent is extended or adjusted under 35 U.S.C. 154(b) by 1431 days.

(21) Appl. No.: 14/886,542

(22) Filed: Oct. 19, 2015

(65) Prior Publication Data

US 2016/0109495 A1    Apr. 21, 2016

Related U.S. Application Data

(60) Provisional application No. 62/065,381, filed on Oct. 17, 2014.

(51) Int. Cl.
| | |
|---|---|
| *H04L 29/08* | (2006.01) |
| *G06F 40/106* | (2020.01) |
| *G01R 19/25* | (2006.01) |
| *G01R 22/10* | (2006.01) |
| *G01R 22/06* | (2006.01) |

(52) U.S. Cl.
CPC ......... *H04L 67/12* (2013.01); *G06F 40/106* (2020.01); *H04L 67/303* (2013.01); *G01R 19/2513* (2013.01); *G01R 22/063* (2013.01); *G01R 22/10* (2013.01); *Y04S 40/18* (2018.05)

(58) Field of Classification Search
CPC ....................................................... H04L 67/12
See application file for complete search history.

(56) References Cited

U.S. PATENT DOCUMENTS

| | | | |
|---|---|---|---|
| 5,719,564 A * | 2/1998 | Sears | G08C 17/02 340/10.41 |
| 6,345,239 B1 * | 2/2002 | Bowman-Amuah | G06Q 20/10 703/6 |
| 6,393,126 B1 | 5/2002 | van der Kaay et al. | |
| 6,421,354 B1 | 7/2002 | Godlewski | |
| 6,933,857 B2 | 8/2005 | Foote | |
| 7,508,787 B2 | 3/2009 | Doshi et al. | |
| 2005/0265321 A1 * | 12/2005 | Rappaport | H04L 41/147 370/352 |
| 2007/0174467 A1 * | 7/2007 | Ballou | H04L 67/04 709/227 |
| 2016/0072891 A1 * | 3/2016 | Joshi | G06Q 30/0631 370/254 |

* cited by examiner

*Primary Examiner* — John E Breene
*Assistant Examiner* — Jeffrey C Morgan
(74) *Attorney, Agent, or Firm* — Fleit Intellectual Property Law; Jeffrey N. Giunta

(57) ABSTRACT

A system and method that enable analysis and visualization of disparate data to provide actionable insight regarding a smart meter network are disclosed. In some implementations, smart meter grid dashboard functionality may provide an improved and integrated data view and enable dynamic investigations and actions based on smart meter analytics. A method of aggregating and displaying data relevant to operations of an AMI network may provide actionable insight into operation of the network, predict failures, and recommend remedial actions.

7 Claims, 16 Drawing Sheets

NETWORK DEVICES

- ACCESS POINT
  - BLUE SQUARE INDICATES CELL CARRIER IS AT&T
  - GREEN SQUARE INDICATES CELL CARRIER IS VERIZON
  - YELLOW SQUARE INDICATES CELL CARRIER IS SPRINT
- RELAY
  - DARK GREEN CIRCLE ICON

AMI TRUCKS

- REAL TIME LOCATION OF NETWORK SPECIALIST FLEET VEHICLES
  - TRUCK NUMBER
  - PARKED DURATION
  - SPEED
- GREEN TRUCK ICON DENOTES VEHICLE MOVEMENT
- RED TRUCK ICON DENOTES VEHICLE IS IDLE OR PARKED

Single Path Meters (Cont.)

Device Name – Unique character and number combination assigned to each device
Meter Count – Number of single path meters associated to the primary path of a network Access Point
Frequency – Number of times a meter has appeared in a single path report within a 5 day time series
Admin Status – UIQ reflection of the CIS Mainframe status of the account
Operational Status – UIQ reflection of the field status of the device
Region – An area of land that has common features
Division – FR, geographical service area denoted by a number (ex. District X)
MAC Address – Unique identifier for network interfaces for communication

Last 5 Percent Meter Reads (Cont.)

Region – An area of land that has common features
District – FPL geographical service area denoted by a number (ex. District 72)
Cluster Key – Numerical designation of meters consistently appearing in the last 6 percent of GMR runs
Meter Count – Number of meters within each cluster key
Device – Unique character and number combination assigned to each device
Premise – Unique numeric designation of customer address
Total Appearance – Number of times a meter has appeared in last 5 percent of GMR runs and retry jobs
Day 4 – Number of times a meter has appeared within 4 days in last 5 percent of GMR runs and retry jobs
Day 3 – Number of times a meter has appeared within 3 days in last 5 percent of GMR runs and retry jobs
Day 2 – Number of times a meter has appeared within 2 days in last 5 percent of GMR runs and retry jobs
Day 1 – Number of times a meter has appeared within 1 day in last 5 percent of GMR runs and retry jobs
Success Reads – Number of times a meter has successfully read over a number of trials
Meter Type – Legend threshold color

SYSTEM AND METHOD FOR ANALYZING AND MONITORING SMART METER NETWORK COMMUNICATIONS

CROSS-REFERENCE TO RELATED APPLICATIONS

This application claims the benefit of U.S. provisional patent application Ser. No. 62/065,381, filed Oct. 17, 2014, the entire contents of which are herein incorporated by reference.

FIELD OF THE DISCLOSURE

The present disclosure relates generally to monitoring and analyzing smart meter network communications, and more particularly to a system and method that enable analysis and visualization of disparate data to provide actionable insight.

BACKGROUND

Given the increasing pace of business, utility companies often utilize visual analytics for rapid, timely decision-making. These visual analytics have included the use of smart metering (e.g., use of advanced metering infrastructure, or "AMI," meters) dashboards, customer experience dashboards, remote connect service dashboards, and meter operations processes. Various dashboards can combine customer data and geospatial information for situational awareness and analysis. There are many advantages in utilizing visual analytics to improve and develop smart meter operations.

Uses of smart meter networks and visual analytics have become increasingly beneficial to utility providers. Examples of the kinds of operations that can benefit from smart meter data include billing, customer dashboards and service information dissemination, distribution automation, theft detection, outage verification, proactive outage/restoration confirmation, Remote Connect Service ("RCS"), and power quality.

Smart grid meter operations are often staffed by smart grid meter operation and network teams. For example, a smart grid network team may be comprised of one or more network technicians, lead technicians, and supervisors that are strategically placed in work regions. A smart grid operations team may be centralized in one office and may be comprised of one or more representatives, lead representatives, and supervisors. The objectives of the operations team may include: developing a team with appropriate skill sets; developing formalized work or standard operating procedures; embedding service level agreements (SLAs) into processes; maintaining open communications with stakeholders; and developing tools to make better, quicker decisions.

Utility companies have installed and activated millions of smart meters throughout the country. To satisfy business demands, smart grid meter operations dashboards have recently become more interactive, allowing utility companies efficiently to investigate and address meter problems or abnormal operating characteristics. Despite the advantages realized by use of dashboards, there is limited information that can be gathered through the use of a dashboard unless suitable analytics are applied to predict network failures that may impact network communications before those failures occur. Thus, there is still a need for smart grid dashboard functionality that provides an improved and integrated data view, and that enables dynamic investigations and actions based on smart meter analytics.

BRIEF SUMMARY OF THE DISCLOSURE

The following presents a simplified summary of the disclosure in order to provide a basic understanding of some aspects of the disclosure. This summary is not an extensive overview of the disclosure. It is intended neither to identify key or critical elements of the disclosure nor to delineate the scope of the system and method disclosed herein; its sole purpose is to present some concepts of the disclosure in a simplified form as a prelude to the more detailed description that is presented later.

The system and method of the present disclosure generally include a suite of tools for use in connection with a Network Operations Center ("NOC") in communication with a smart meter network. The unique suite of network monitoring and analysis tools is designed proactively to predict network failures that may impact network communications before the failures happen and to respond to network impacting conditions (or "exceptions") at the earliest possible interval. The reduction or minimization of network impacting exceptions helps avoid communication interruptions that impact meter reads, connects, and disconnects as well as outage processing.

The following description and the appended drawings set forth certain illustrative aspects of the implementations presented in the disclosure. These aspects are indicative, however, of but a few of the various ways in which the principles of the disclosure may be employed, and the various implementations and arrangements are intended to include all such aspects and their equivalents. Other advantages and novel features will become apparent from the following description when considered in conjunction with the drawings.

BRIEF DESCRIPTION OF THE DRAWING FIGURES

FIGS. 4-16 illustrate graphical displays of network operations, health, optimization, and restoration management data in accordance with a system and method of aggregating and displaying network data.

DETAILED DESCRIPTION

Figure 1:
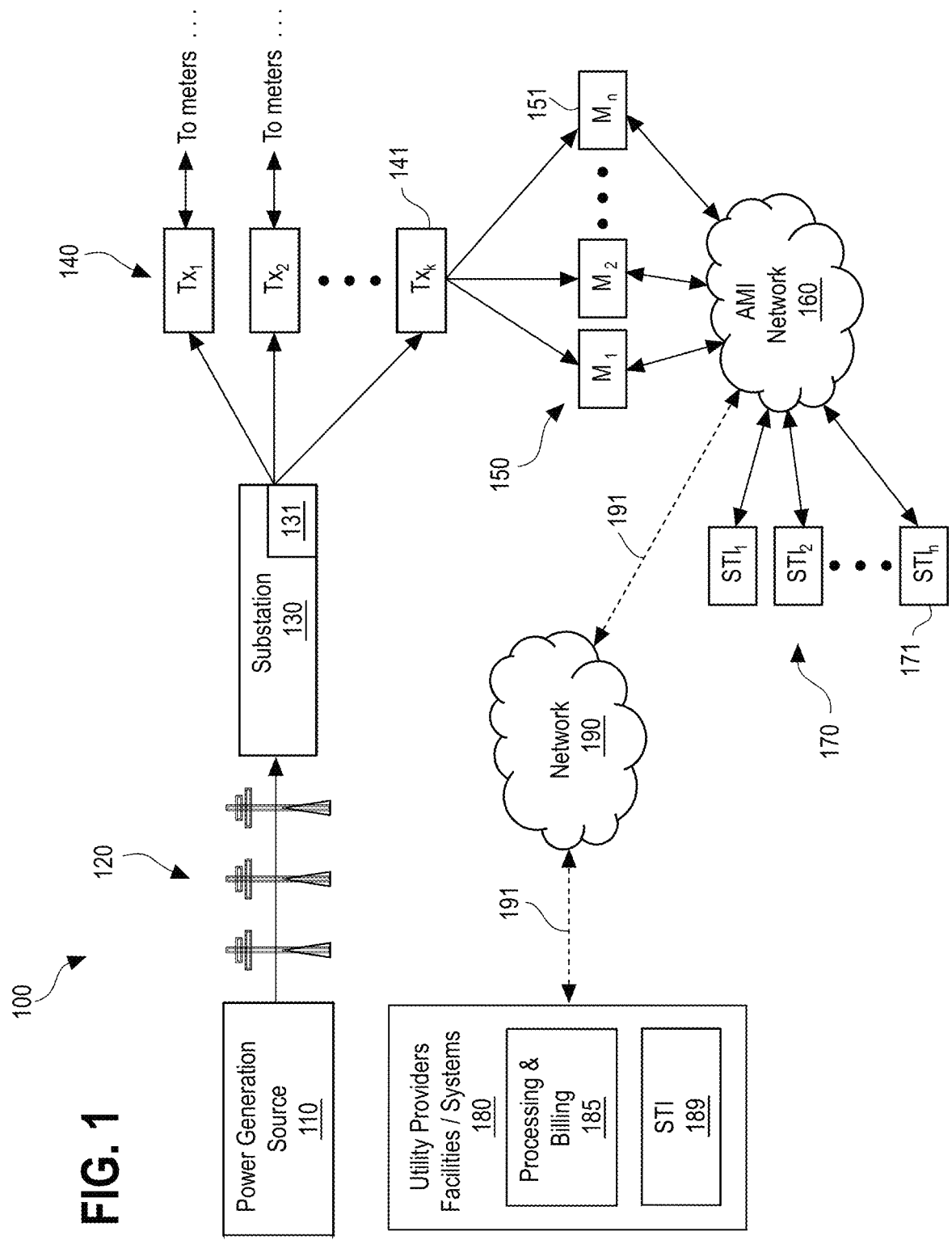
FIG. 1 is a simplified block diagram illustrating components of a metered electric utility distribution system.

The following detailed description and the appended drawings describe and illustrate some implementations of a system and method for the purpose of enabling one of ordinary skill in the relevant art to make and use these implementations. As such, the detailed description and drawings are purely illustrative in nature and are in no way intended to limit the scope of the disclosure in any manner. It should also be understood that the drawings are not necessarily to scale and in certain instances details, which are not necessary for an understanding of the disclosure, may have been omitted, such as details of fabrication and assembly. In the accompanying drawings, like numerals represent like components.

As will be appreciated by those skilled in the art, portions of the present system and method may be implemented as a method, a data processing system, or a computer program product. Accordingly, these portions of the present system and method may be implemented entirely in hardware, entirely in software, or in a combination incorporating both software and hardware aspects. Furthermore, portions of the present system and method may be implemented as a computer program product on a computer-usable storage medium having computer readable program code on the medium. Any suitable computer readable medium may be utilized including, but not limited to, static and dynamic storage devices, hard disks, optical storage devices, and magnetic storage devices. Those arrangements implemented entirely in software may be operative in conjunction with a computer employing or comprising, for example, a microprocessor, a microcontroller, or some other electronic hardware component, that is suitably configured to facilitate the functionality set forth below.

The present system and method are described below with reference to illustrations of methods, systems, and computer program products according to the disclosed implementations. As noted above, it will be understood that individual blocks depicted in the drawing figures, as well as certain combinations of blocks depicted in the drawing figures, may be implemented by computer program instructions, hardware devices, or a combination of both. These computer program instructions may be provided to a processor of a general purpose computer, special purpose computer, or other programmable data processing apparatus to produce or enable a particular machine, such that the instructions, which execute via the processor of the computer or other programmable data processing apparatus, implement the functions specified in the block or blocks, either individually or in combination.

Aspects of the present system and method may be implemented on one or more computing devices, including one or more servers, one or more client terminals, including computer terminals, a combination thereof, or on any of myriad computing devices currently known in the art, including without limitation, personal computers, laptops, notebook or tablet computers, touch pads, multi-touch devices, smart phones, personal digital assistants, other multi-function devices, stand-alone kiosks, etc.

The dashboards and system architecture of the present disclosure allow access to data in disparate formats from a wide range of systems. Once accessed, the data may then be correlated across space, time, and nodes in a network. The data may be analyzed to facilitate situational awareness and analysis. In some implementations, the analyzed data may be presented in a wide range of intuitive visual formats. Thus, the analysis and visualization of disparate data provide actionable insight. The foregoing functionality may be referred to as Space-Time Insight (or "STI"), which, as set forth in detail below, seeks to identify both events or circumstances that have occurred or may be likely to occur as well as action items that may be appropriate in response or as a preventative measure.

Turning now to the drawing figures, FIG. 1 is a simplified block diagram illustrating components of a metered electric utility distribution system. As illustrated, a metered electric utility distribution system 100 generally includes a power generation source 110 that is operative to generate electric power in accordance with one or more technologies and to distribute same via transmission lines 120. In that regard, source 110 may employ or included a hydro-electric plant, a fossil fuel or coal-fired plant, a nuclear plant, a wind farm or a solar array or collector and attendant structures, a geothermal plant, or a combination of these and other facilities that are known or developed in accordance with known principles and technologies to generate electric power. Nuclear reactors, steam, gas, or water-driven turbines, rotors, stators, solar panels, cooling towers, and various other ancillary equipment and machinery are omitted from FIG. 1 for clarity, but may be employed at or in cooperation with source 110 as is generally known, and it will be appreciated that these omitted details may be application-specific. In some implementations, transmission lines 120 may carry high-voltage alternating current (or "AC") electric power from source 110 to a desired destination as is generally known, though other technologies for distributing electric power across distances, as may be appropriate for a particular application and based upon technological readiness and suitability, are contemplated. In particular, the present disclosure is not intended to be limited by the structural or operational characteristics of source 110 or transmission lines 120, or by the nature of the electric power and the manner in which it is generated or transmitted.

In some practical applications, electric power generated at source 110 may be transmitted via transmission lines 120 to a power transfer substation 130 which, in turn, distributes electric power to transformers ($Tx_1$, $Tx_2$, . . . $Tx_n$) 140 for subsequent transmission to metered sites that are generally represented in FIG. 1 as meters ($M_1$, $M_2$, . . . $M_n$) 150. It is noted that a metered electric utility distribution system 100 may generally include more substations (such as substation 130) than depicted in FIG. 1, and that each such substation 130 may serve many more transformers (such as transformers 140) than illustrated. Similarly, each such transformer 140, such as specific transformer 141, may provide electric power to more meters (such as meters 150, or specific meter 151) than are depicted in FIG. 1. In that regard, the present disclosure is not intended to be limited by the simplified topography represented in the drawing figures.

In operation, substation 130 may modify or condition the electricity received from source 110 such that it may then be transmitted to transformers 140. For example, it may be desirable in some circumstance to step down (or to step up) voltage via one or more substation transformers 131, or to phase-shift or otherwise to adjust current phase or amplitude, for instance, to achieve a desired power function as specified by the kind of load and/or to minimize energy lost in the distribution system. Various techniques are known or may be developed to condition electric power at substation 130, and the present disclosure is not intended to be limited by the operation of substation 130 or by any technical procedures executed or functionality employed there.

Similarly, transformers 140, in general, and specific transformer 141, in particular, may be configured and operative further to condition the electric power received from substation 130 such that it is suitable for delivery to customers or loads associated with meters 150. Voltage manipulation, current manipulation, or a both, may be employed in various situations; the nature and extent of such conditioning may be dependent upon the specifications and operational characteristics of the meters 150 to which electric power is delivered, for example, or upon governmental regulations, technological or infrastructure capabilities, or a combination of these and other factors. The present disclosure is not intended to be limited by the technologies employed at transformers 140.

Meters 150, in general, and specific meter 151, in particular, may be configured to meter electric power usage at a particular residence, building, business location, or some other specific site. In some circumstances (where available from and supported by a particular utility service provider, for instance, or where required by a state or local utility oversight commission or committee), meters 150, 151 may be operative in accordance with advanced metering infrastructure (or "AMI") specifications or protocols.

In that regard, meters 150, including specific meter 151, may be configured as or include what are generally referred to as "smart meters" or "AMI meters." In operation, when implemented as a smart meter, meters 150, 151 may monitor, sense, record, or otherwise track electrical consumption (or "usage") digitally and at predetermined or dynamically adjustable intervals; subsequently or effectively contemporaneously, meters 150, 151 may transmit usage data (e.g., using a secure radio frequency band or other telecommunications methodology) to other devices installed on or otherwise communicably coupled to the electrical grid or to a communications network (such as AMI network 160) with which meters 150,151 may exchange data. In this context, it will be understood that "usage data" may refer to raw data (i.e., unmodified or unprocessed data as they are collected and that represent the amount of electrical energy consumed at the location metered by meters 150, 151) or to data and other information relating to or derived from such raw data (e.g., readings or data points that may be time-stamped or otherwise processed to provide more information than simply an aggregate or a measure of cumulative consumption). For example, in some instances, an aggregate usage value may be transmitted from such a smart meter, while in other instances, detailed, time-dependent usage rates may be transmitted; the specific type and amount of data collected and processed at, and transmitted from, meters 150, 151 may be application-specific and may vary in accordance with processing or computational capabilities of hardware components deployed in, as well as software functionalities implemented at or in cooperation with, meters 150, 151. These factors may be affected by technological or economic considerations, for example, or may be dictated or influenced by applicable governing bodies or governmental regulations.

As illustrated in FIG. 1, smart meters, such as meters 150, 151, may be communicably coupled to AMI network 160 such that usage data collected (and possibly processed) by meters 150, 151 may be transmitted to AMI network 160.

In operation, AMI network 160 may be communicably coupled to a utility provider's facilities and computer systems (hereinafter generally referred to as "systems" 180). As illustrated in FIG. 1, communication may be enabled or facilitated by a network 190. In this configuration, network 190 may represent the Internet, for instance, or any other packet-switched data network, virtual private network, proprietary or public wide area network ("WAN"), or any other communications network capable of bi-directional data communication between AMI network 160 and systems 180. In some arrangements, it may be desirable to omit network 190 altogether, such that AMI network 160 communicates with systems 180 directly, i.e., without an intervening network, such as network 190; accordingly, the network connections (reference numeral 191) between network 190 and systems 180, on the one hand, and AMI network 160, on the other hand, are illustrated as dashed lines to indicate that such connections may optionally be omitted in some situations.

At a service provider's facilities, systems 180 generally include processing and billing systems 185, as is generally known. In FIG. 1, block 185 represents the various monitoring, customer service, troubleshooting, maintenance, load balancing, accounting, billing, and other types of activities that may be used to operate a utility service. In some instances where such activities are computationally expensive or require a great deal of processor power or communication bandwidth, some implementations of processing and billing systems 185 may be distributed across many processing and memory storage resources, and even distributed across buildings as is generally known in the art. Accordingly, though systems 180 are depicted in FIG. 1 as a single, unified entity, it will be appreciated that block 180 may represent any number of physical buildings, computer server facilities, and other physical and logical resources owned, operated, or otherwise under the control of the relevant utility service provider.

Systems 180 also may include an STI component 189. In operation, STI component 189 may coordinate with processing and billing systems 185, and may share some of the same processing, memory, database, or other hardware resources, for example. As set forth in more detail below, STI component 189 may provide, either independently or in cooperation with other hardware or software components, functionality operative to enable analysis and visualization of disparate data (collected, for example, from devices coupled to AMI network 160) to provide actionable insight.

In some architectures, AMI network 160 may additionally be communicably coupled to STI modules ($STI_1$, $STI_2$, . . . $STI_n$) represented in FIG. 1 by reference numeral 170. As noted above, STI modules 170, in general, and specific STI module 171, in particular, may be embodied in or include personal computers, laptops, notebook or tablet computers, touch pads, multi-function devices, and the like. It may be desirable that STI modules 170, 171 provide the same or similar functionality as that provided by STI component 189, though in an environment that is remote from a service provider's systems 180. It is noted that STI modules 170, 171 may readily communicate with STI component 189 via AMI network 160, either independently or in cooperation with network 190 as set forth above.

Figure 2:
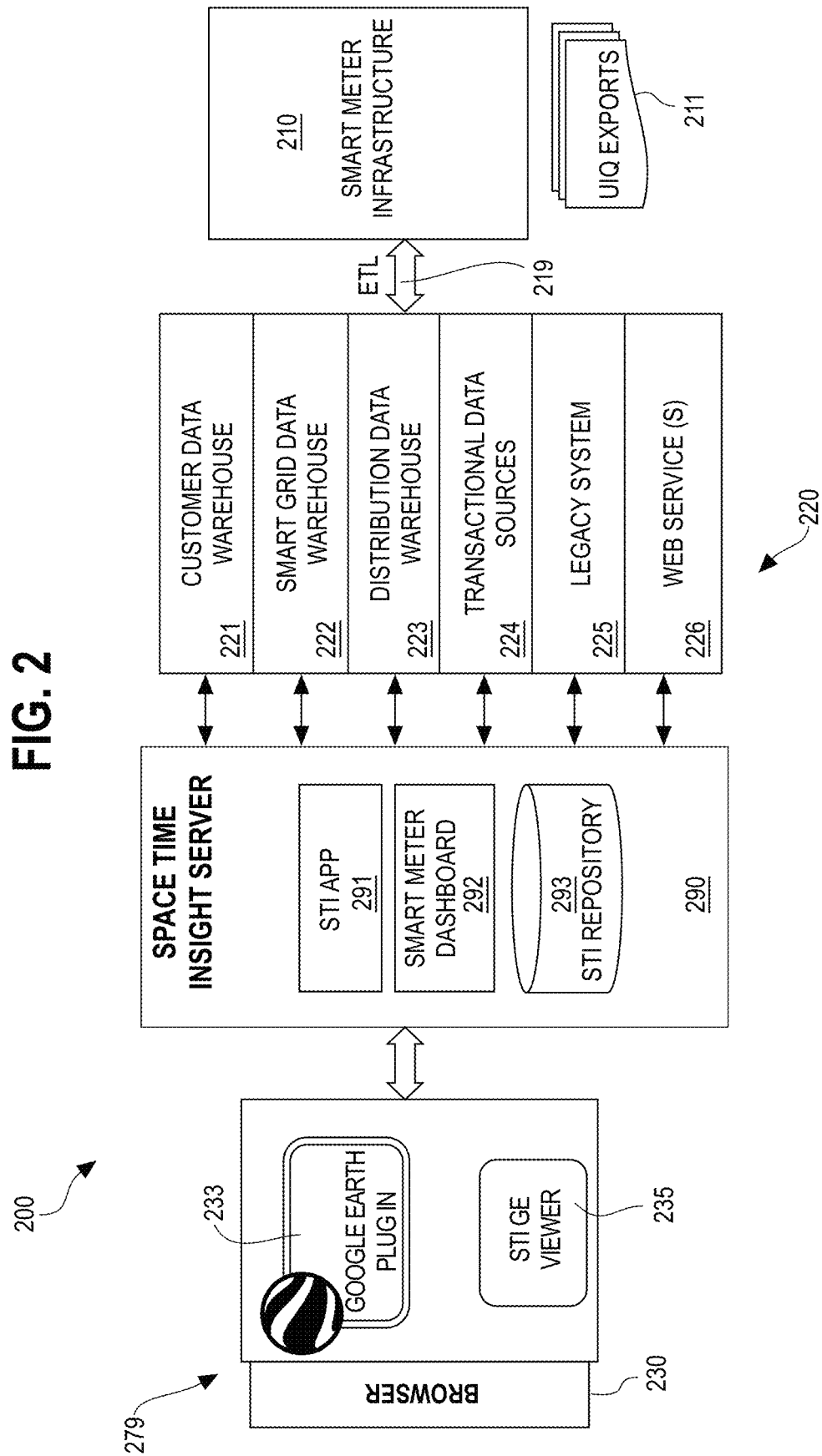
FIG. 2 is a simplified block diagram illustrating components of a dashboard architecture for use in cooperation with a smart meter infrastructure.

FIG. 2 is a simplified block diagram illustrating components of a dashboard architecture for use in cooperation with a smart meter infrastructure (e.g., for use in connection with AMI meters) in accordance with one implementation. Aspects of the architecture illustrated in FIG. 2 are disclosed in co-pending U.S. patent application Ser. No. 14/532,326 (filed Nov. 4, 2014) and Ser. No. 14/584,377 (filed Dec. 29, 2014), the disclosures of which are hereby incorporated herein in their entireties.

As illustrated in FIG. 2, a unique architecture 200 may generally include a smart meter infrastructure 210, a data storage and web services component ("services component," reference numeral 220), an STI server 290, and a terminal 279 (e.g., such as a remote terminal) configured and operative to execute a network or web browser or other network access application ("browser," reference numeral 230). Architecture 200 may be used for integrating smart meter infrastructure 210 with a variety of third party tools and services including, but not limited to, the illustrated STI server 290, Google Earth™ or other mapping or locational tools ("map tool," reference numeral 233), and browser 230.

It will be appreciated that various of the components or functional blocks depicted in FIG. 2 may be elements of, or implemented in association with, AMI network 160 of FIG. 1. Specifically, smart meter infrastructure 210 may generally represent the hardware elements, telecommunications resources, and infrastructure topology underlying AMI network 160 that enable communicable coupling of meters 150, 151 with STI modules 170, network 190, systems 180, or a combination of these and other networks or hardware components. Similarly, services component 220 and STI server 290 may be physically or logically resident at AMI network 160 as is generally known in the art of distributed resource computing architectures. Additionally or alternatively, some or all of the functionality associated with services component 220, STI server 290, or both, may be resident at network 190, depending upon the specific network topology designed and implemented by the utility service provider.

In some implementations, smart meter infrastructure 210 may be embodied in or include an operational data store for all meter data (e.g., usage data as described above) collected from the various meters (such as meters 150, 151) in a particular network of smart meters (such as AMI network 160). These usage data include, inter alia, scheduled read jobs as well as data related to dynamic events that may cause a specific meter 151 to provide alerts and/or to generate actionable events with respect to power down conditions or other circumstances affecting operation. Additionally or alternatively, network events and/or data regarding network conditions and functionality received from access points, relays, or other hardware included in or associated with smart meter infrastructure 210 may also be monitored and analyzed. For example, data from these infrastructure elements may be used to create new actionable events for analysis or remediation. These alerts or actionable events may be processed by an element in smart meter infrastructure 210 (such as at STI server 290, for instance) or at systems 180, depending upon the discretion of the utility server provider and the relative computational bandwidth of the various network components.

As is generally known, smart meter infrastructure 210 may include or employ UIQ ("User Interface IQ") exports 211. Specifically, UIQ exports 211 may be embodied in or include monitoring tools for an Information Management ("IM") business unit; in operation, UIQ exports 211 generally allow users, such as IM personnel, to manage the technical environment of smart meter infrastructure 210 in a desired manner, facilitated by an appropriately designed or selectively configurable user interface. These tools may enable or support collection or aggregation of inputs (such as scheduled read jobs to pull usage data, dynamic events, and alerts, etc.) from the networked elements (such as meters 150, 151, relays, access points, etc.) of smart meter infrastructure 210 as well as organization, pairing, and export of specific data transactions to create a store of data (or "data marts") for enterprise business consumption. The data generated by smart meter infrastructure 210 may be shared, either independently or in cooperation with tools such as UIQ exports 211, with services component 220, for instance, through the use of web services, cloud computing services, distributed memory systems, or other suitable mechanisms or infrastructures, for further use or computational activities by various widgets, software applications, processing systems, or data analytics services.

In some implementations, a connection between smart meter infrastructure 210 and services component 220 may be established through an Ethernet Link ("ETL") 219 as illustrated in FIG. 2. It will be appreciated that other communications standards or data transfer protocols may be appropriate in some implementations, depending upon a variety of factors that may be application-specific or particular to the nature and operational characteristics of smart meter infrastructure 210, whether services component 220 is implemented as part of AMI network 160 or network 190, or a combination of these and other factors.

As noted above, STI server 290 generally refers to any hardware component, software or firmware instruction sets, or a combination of these and other elements, that enable or facilitate Space-Time Insight reporting functionality. In some implementations, STI server 290 may generally include a development tool for integrating data from different sources, and in disparate formats, into a user-friendly format or organization that facilitates visualization in a manner such that the data are readily assimilated or understood.

In that regard, the FIG. 2 version of STI server 290 generally includes an STI application 291, a smart meter dashboard 292, and an STI repository 293. In operation, and as set forth below, STI server 290 and all or some of its constituent components or modules 291-293 may receive performance, status, and/or operational data, as well as other relevant information, from the following data sources resident at or associated with services component 220: customer data warehouse 221; smart grid data warehouse 222; distribution data warehouse 223, transactional data sources 224, legacy system 225, and web services 226. These resources maintained at services component 220 may selectively store usage data such as may be relevant to operational characteristics and performance of AMI network 160 and its constituent elements (such as meters 150, 151), as well as usage data related to topographical, historical, and failure information associated with AMI network 160 and its construction and operation. The foregoing usage data may be served to STI server 290 on demand, for instance, as required or requested by STI application 291, or streamed to STI server 290 (in real time or on a predetermined schedule, for example) without the necessity of a particular request or call.

STI Repository 293 may be embodied in or include application libraries that support executable applications, the interaction with which may be facilitated by smart meter dashboard 292; smart meter dashboard 292, in turn, may be embodied in or include a body or repository of widgets (visuals) to make up a NOC suite of tools from the underlying applications or instruction sets in STI repository 293. Finally, STI application 291 may be embodied in or include a tool layer that enables developed NOC applications to work, particularly in cooperation with a viewer application (such as an STI viewer 235) as set forth below. In operation, STI application 291 may employ usage data supplied from services component 220, STI repository 293, or both, and execute instructions to process those usage data in accordance with desired programming to examine, aggregate, analyze, or otherwise to manipulate the data so as to provide useful information or actionable insight into operation of AMI network 160. Subsequent to processing, or concomitantly therewith, results may be provided (for example, to terminal device 279, STI component 189, STI modules 170, 171, or a combination of these) either directly from STI application 291 or in cooperation with dashboard 292.

STI server 290 may communicate data from STI application 291 and dashboard 292 in a desired fashion or visual layout (to a terminal device 279 as indicated in FIG. 2 or to other system elements as set forth above). In some cases, data may be communicated, such as from dashboard 292, in a generic layout or format, and browser 230 or STI viewer 235 may provide formatting or other visual or display characteristics, which may be selectively adjusted or customized as desired by a user or viewer of the data. In that regard, usage data or other information related to operation of AMI network 160 or its constituent components may be supplied from STI server 290 as hypertext markup language ("HTML"), eXtensible markup language ("XML"), or other generic markup language, the display of which is generally determined or governed by instructions resident on the device receiving those data, e.g., terminal device 279, in cooperation with formatting instructions embedded in received data. Alternatively, dashboard 292 may embed formatting data or other instructions that predetermine the visual layout or representation that will or must be implemented at the receiving end, irrespective of the nature and operational characteristics of a browser 230 or STI viewer 235 displaying the usage data.

In operation, STI viewer 235 may be embodied in or employ a tool or software component configured and operative to present usage data or related or associated information in a predetermined or user-defined manner, such as in conjunction with browser 230. Specifically, STI viewer 235 may coordinate with browser 230, or may be implemented as an independent visualization application used to display usage data or other information provided from STI application 291. It may be desirable to present usage data and other information on a map, such as superimposed on a cartographic, satellite, or composite image of a particular geographic area. In that regard, map tool 233 may be used for integration with usage data from STI application 291 and dashboard 292 to provide a display of desired information in conjunction with STI viewer 235, browser 230, or both. Browser 230 may be any web browser or other network access application configured and operative to receive and to display data received from AMI network 160 or network 190 (if included, depending upon the specific network architecture as set forth above). In some instances, browser 230 may be configured to receive HTML or other markup language data.

Terminal device 279 may generally correspond to STI modules 170, 171 or to STI component 189 described above with reference to FIG. 1. As implemented in FIG. 1, STI modules 170, 171 and STI component 189 may be embodied in or include some or all of the elements of terminal device 279, and may execute similar functionality, specifically: these may display usage data or other information provided from STI application 291 in a manner selected by or customized by a viewer.

Figure 3:
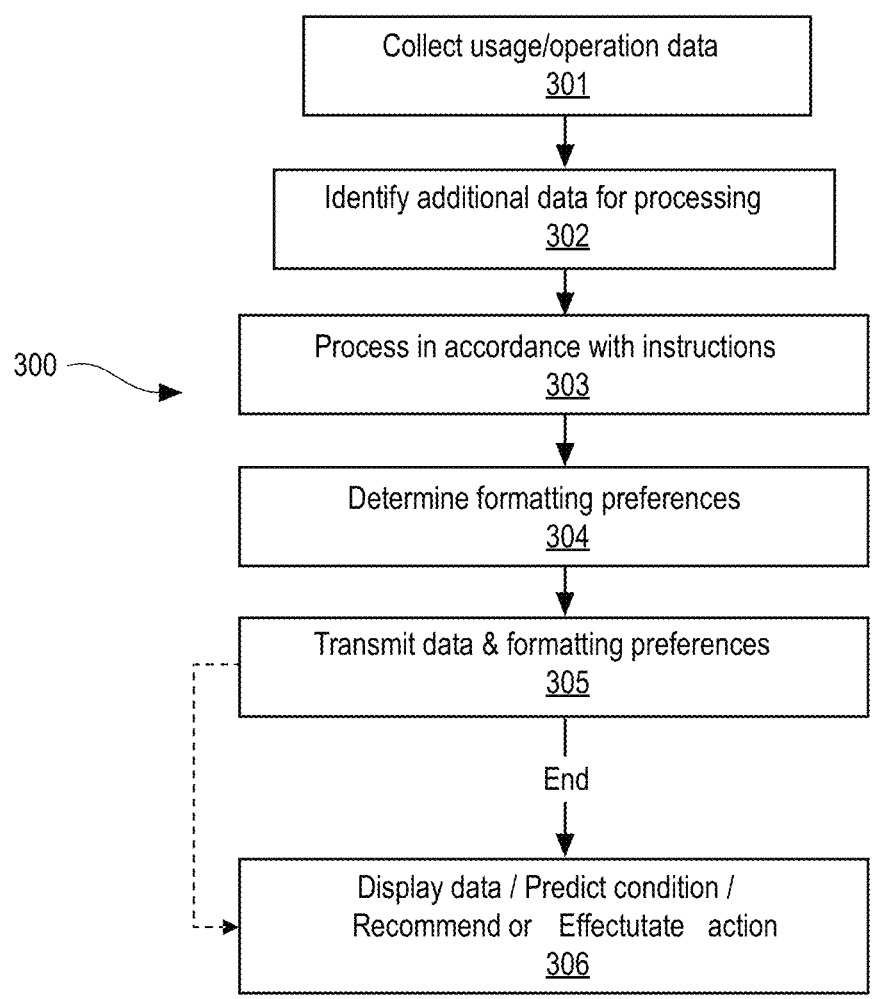
FIG. 3 is a simplified flow diagram illustrating a method of aggregating and displaying network data.

In the foregoing manner, a method of aggregating and displaying data relevant to operations of an AMI network may provide actionable insight. FIG. 3 is a simplified flow diagram illustrating a method of aggregating and displaying network data. As indicated in FIG. 3, a method 300 may begin (at block 301) with collecting usage data related to operation of a smart meter or other device. At block 302, additional data may selectively be identified for use in processing operations.

As noted above, usage data may be related to instantaneous usage, time-dependent usage, hardware or software failures, recording errors, time since last maintenance, or other operational features and characteristics of a specific meter (such as specific meter 151) or a collection of meters (such as meters 150). Additional data selectively identified for processing may include historical, geographical, or transactional data associated with a particular monitored network (such as AMI network 160), or information related to a particular customer or collection of customers, for instance. These additional data may reside on services component 220 as set forth above, or may be otherwise accessible via a communications network by STI server 290.

Usage data and selectively identified data may be processed as desired to render usable output as indicated at block 303; it will be appreciated from the foregoing that the output of such a processing operation may be related to operation of a metered utility distribution network. It will also be appreciated that various processing routines may be appropriate, depending upon the specific analysis or network examination under consideration. For example, it may be desirable to provide a visual representation of malfunctioning meters superimposed on a map; additionally or alternatively, it may be desirable to locate mobile resources on a map in real time or near real time, or to trace the whereabouts of such resources during a particular time period in the past. Further, a method as set forth herein may generate new actionable events, such as from usage data and selectively identified data, as set forth below. In some instances, a "threshold" event—determined as a result of processing—may generate a service request, maintenance orders, or other action items based, at least in part, upon usage data and other selectively identified data relevant to network functionality and current or projected operational status. These and other processing operations are contemplated at block 303. In the FIG. 2 arrangement, such processing may be executed by STI application 291, supported by dashboard 292 and STI repository 293, as set forth above. Accordingly, processing at block 303 may be determined or facilitated by the instruction sets defining STI application 291, and may be customized or selectively modified in accordance with requirements or goals of a utility provider that owns or operates AMI network 160 and STI server 290.

Formatting preferences may be identified or determined as indicated at block 304. As set forth above, it may be desirable to format processing output into a readily understandable visual layout dictated or governed by a particular application (such as STI application 291). In some instances, such as may be enabled in the FIG. 2 arrangement, this may be accomplished in cooperation with dashboard 292. In these situations, processing output may be formatted, either subsequent to processing or during processing, prior to transmission to a particular destination. Alternatively, it may be desirable to allow a device, apparatus, or component at the destination (such as terminal device 279) to establish visual formatting preferences. In such instances, STI application 291 or other processing component may determine that no formatting instructions should be embedded with output data, or that any embedded instructions should enable a receiving device to determine visual display characteristics.

Processing output and formatting preferences may be transmitted to a receiving device as indicated at block 305. As noted above, a receiving device may be embodied in or include STI component 189, STI modules 170, 171, terminal device 279, or any other apparatus configured and operative to interact with STI server 290 for the purpose of receiving analytics and other usage data associated with a communications network such as AMI network 160. In particular, such as receiving device may employ an STI viewer 235 or other proprietary or generic viewer construct that is interoperative with STI server 290; in some implementations, such a viewer may be a downloadable plug-in for browser 230 or a stand-alone application. In any event, a method as set forth herein may transmit output and formatting preferences to a receiving device that is operative to render a visual display in accordance with the nature of the formatting preferences. In that regard, a method may optionally include (block 306) displaying processing output in accordance with the formatting preferences; such displaying may be supported or facilitated by the apparatus and software described above with reference to FIGS. 1 and 2, for example.

As indicated by the dashed arrow to block 306, a method may optionally include several processes, such as displaying noted above, as well as predicting, recommending, and effectuating as set forth in detail below. Those of skill in the art will appreciate that various other processes may be employed, depending upon, for example, the nature of the usage data collected and the type of information sought to be provided to the utility provider.

Additional drawing figures illustrate several features and aspects of a system and method that are operative as set forth herein. In that regard, FIGS. 4-16 illustrate graphical displays of network operations, health, optimization, and restoration management data in accordance with a system and method of aggregating and displaying network data.

Figure 4:
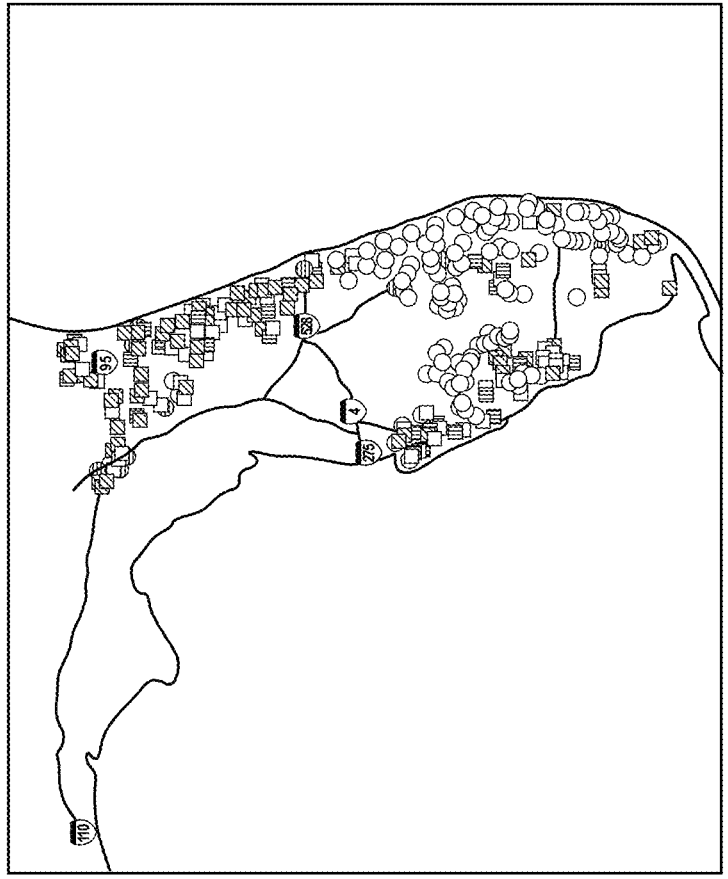
Figure 5:
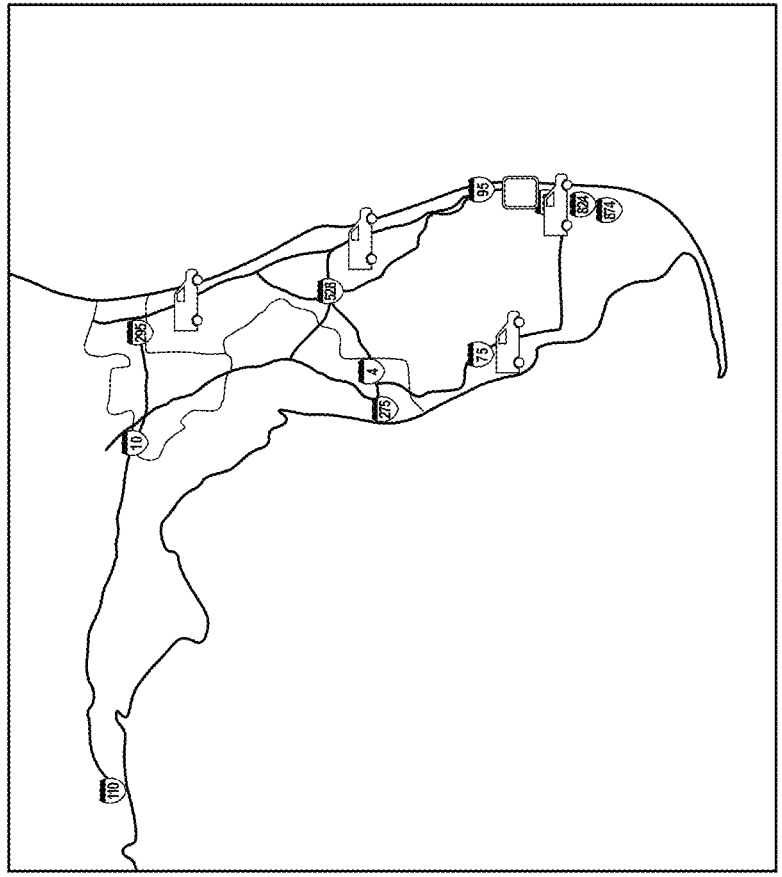

FIG. 4 illustrates network devices, such as access points and relays, superimposed on a map of a geographic region serviced by a utility service provider; different colors, icon styles, or other indicia may be employed to identify with particularity different types, categories, or operational characteristics of the various resources depicted. By way of example, access points may be represented as square icons, with differing colors identifying different cellular carriers or network service providers, whereas relays may be displayed as circle icons (or X icons, etc.). Similarly, FIG. 5 illustrates geographic locations of mobile resources such as trucks or other service vehicles superimposed on a map. Again, differing icons, colors, or other indicia may be used to distinguish the various resources depicted in the visual display; for example, a service vehicle may be represented by reference number, and the display may provide an indication of vehicle speed or the duration that the vehicle has remained parked. As indicated in FIG. 5, it may be desirable to depict a moving vehicle in green, while a stationary vehicle is displayed in red (or some other distinguishing color). These representations may be interactive, for example, such that selection of a particular resource may trigger additional processing operations causing details concerning operation or historical data associated with the particular resource to be displayed. By way of example, tracking a real time or near real time location, as well as movement of, trucks may enable a system and method to issue instructions or to dispatch a particular resource that is closest to a location of interest, such as a failed transformer. Some failures or distribution network anomalies may require examination or correction within a specified time period following an exception, for example, as a matter of corporate best practices, public relations, or governmental or utility commission guidelines. Where a truck or other mobile resource is equipped with a terminal such as STI module 170, it may be deployed with minimal delay to a site requiring attention.

Figure 6:
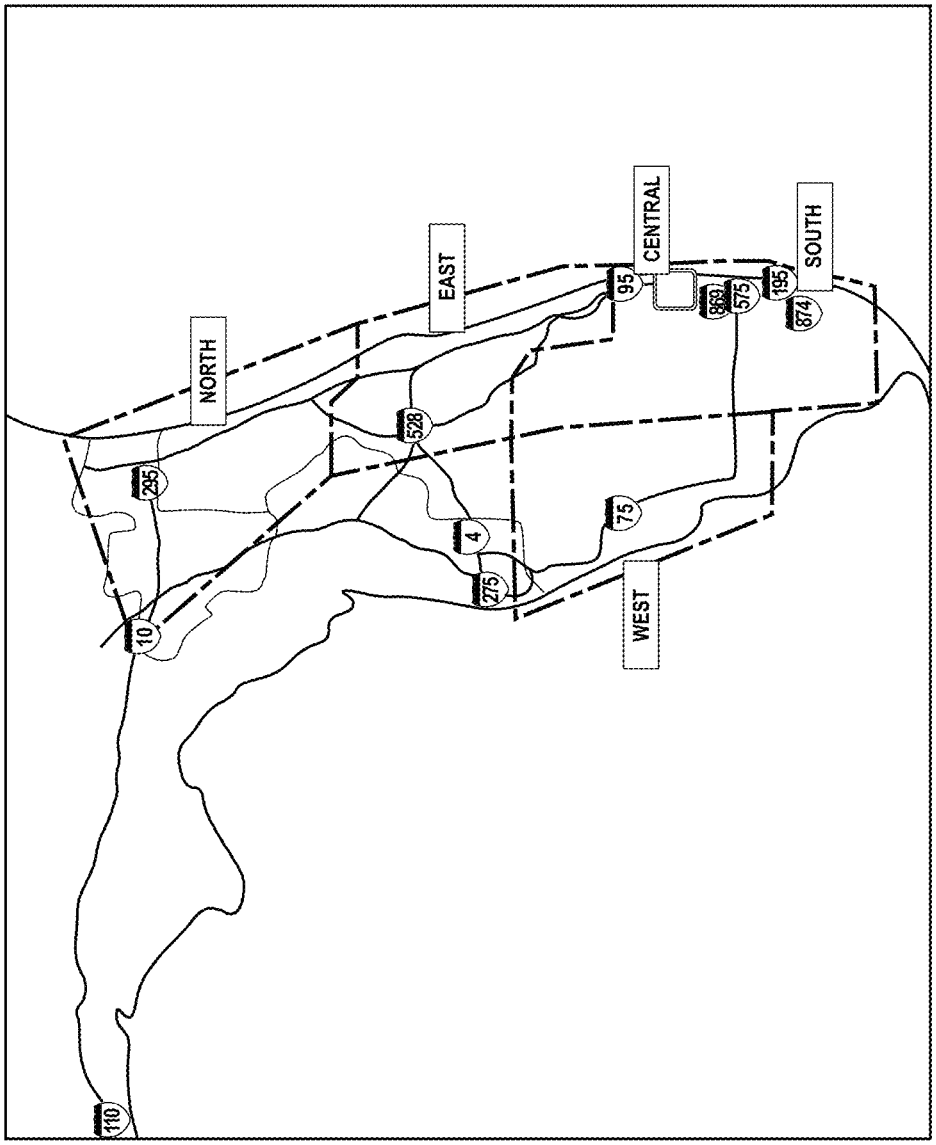
Figure 7:
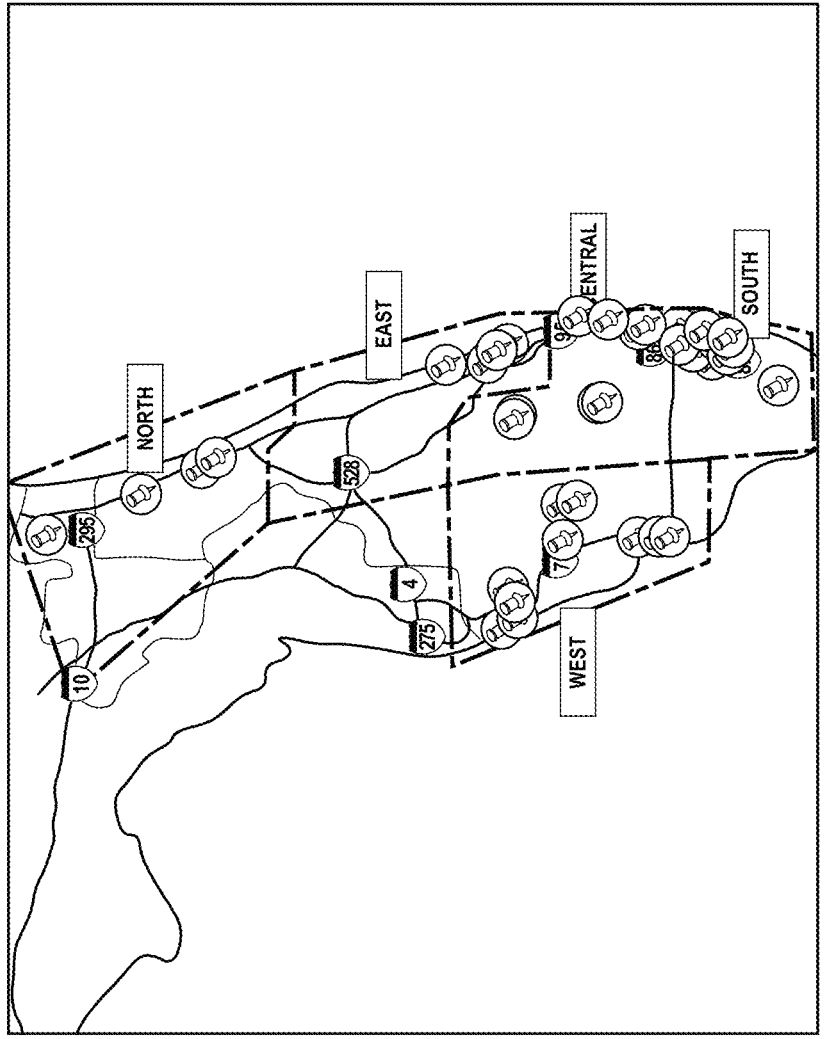
Figure 8:
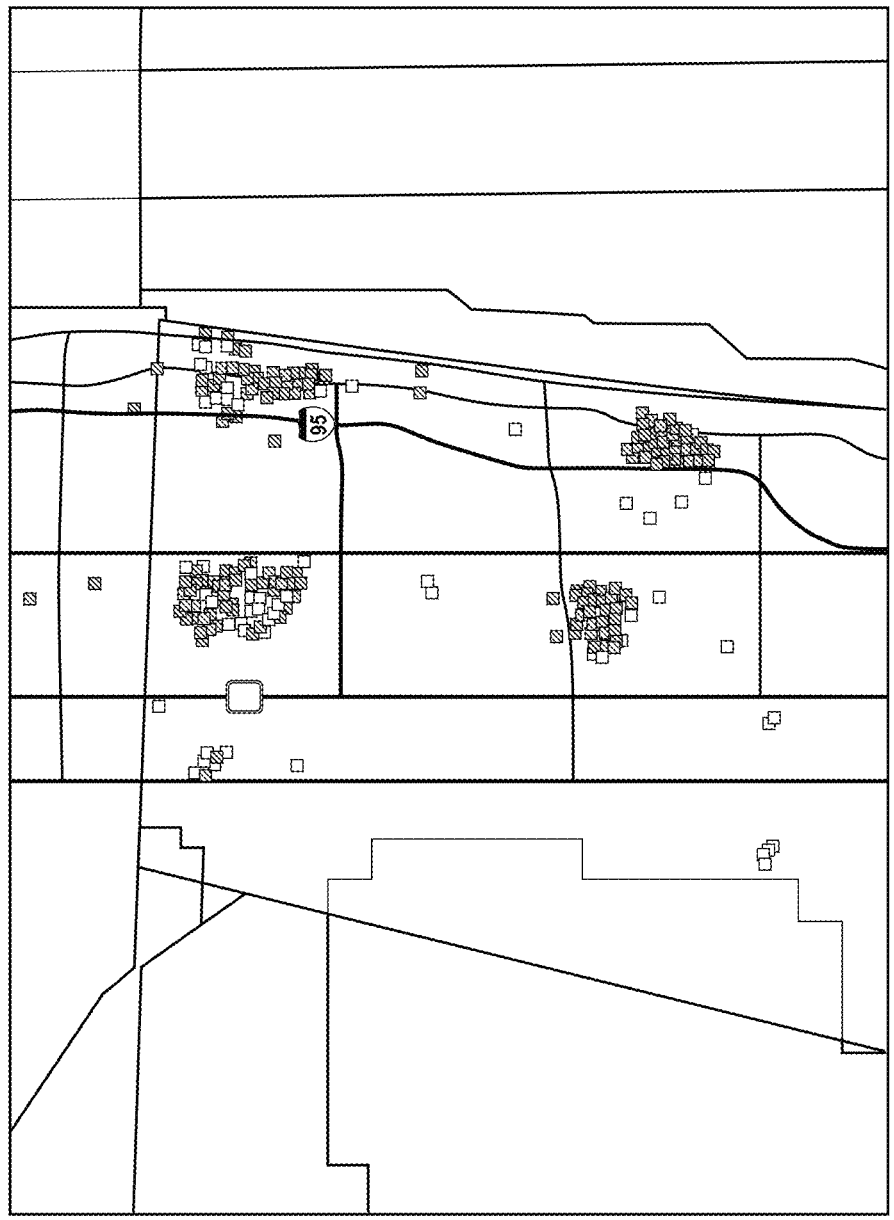
Figure 9:
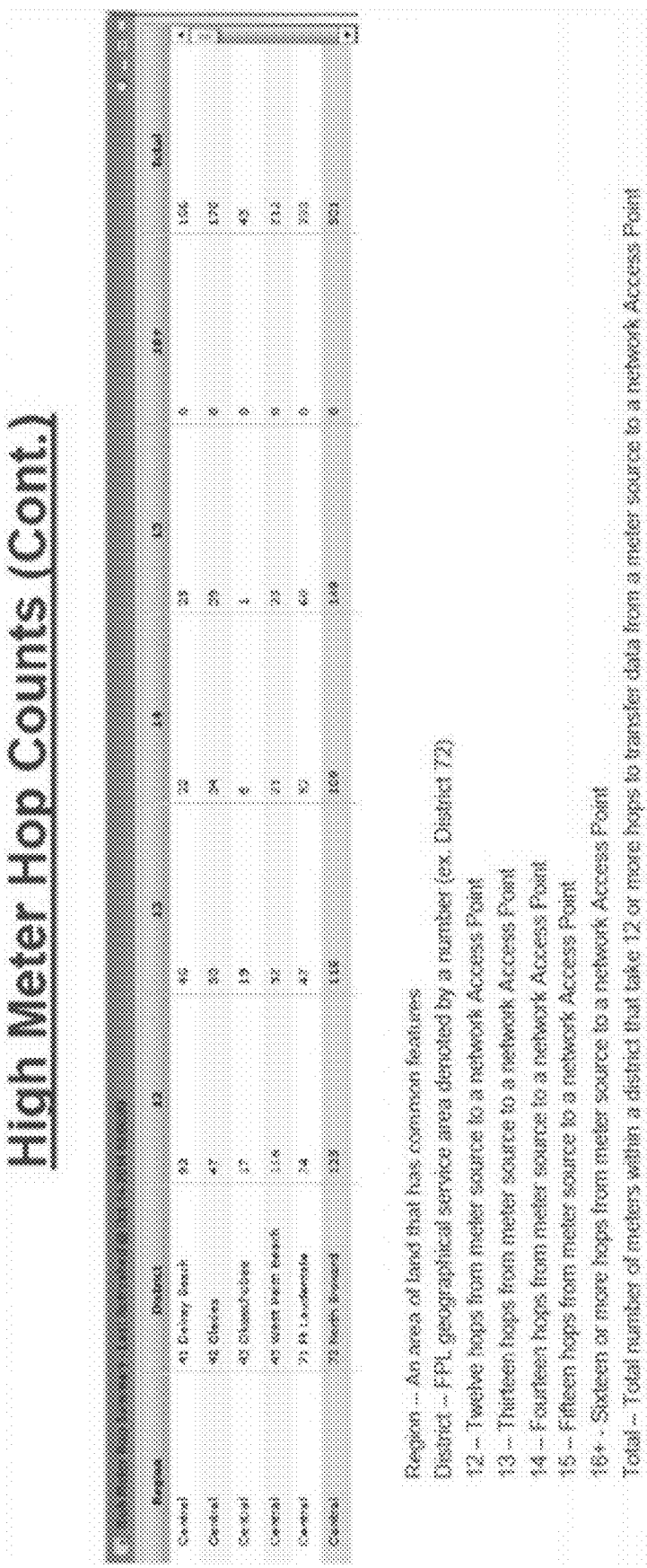
Figure 10:
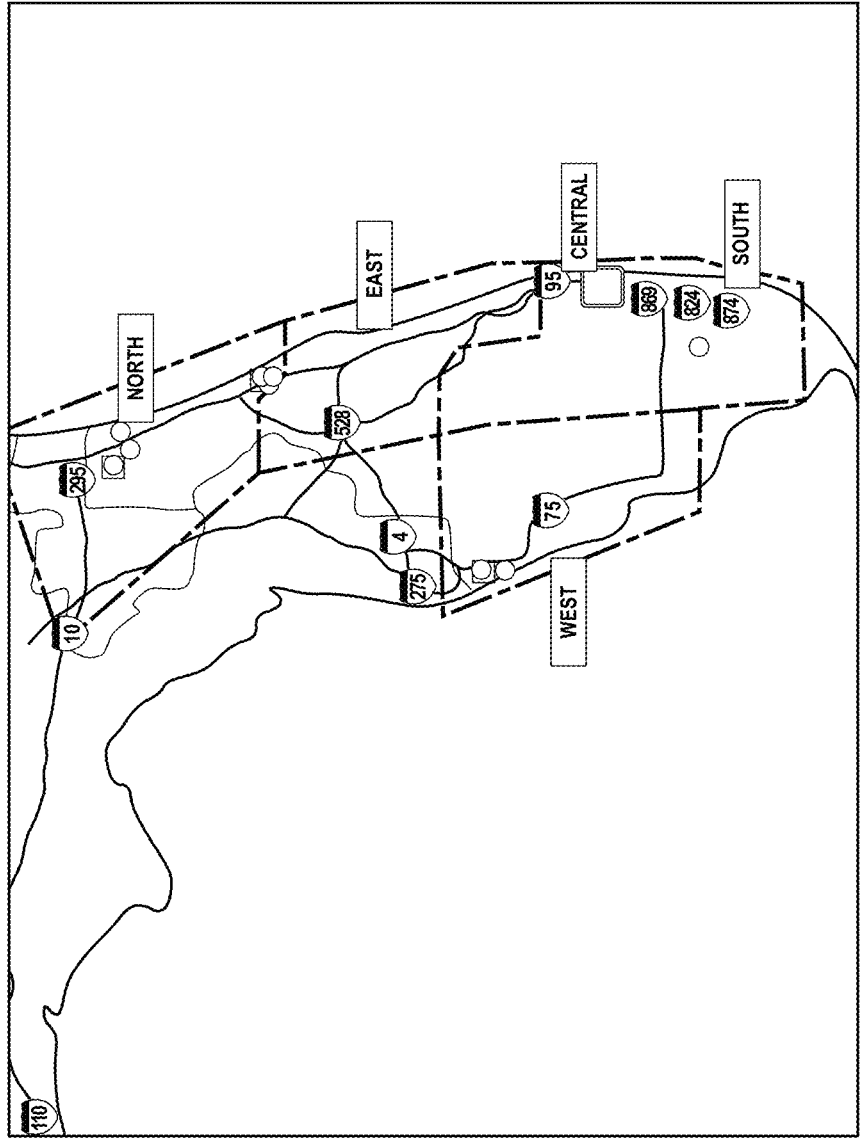
Figure 12:
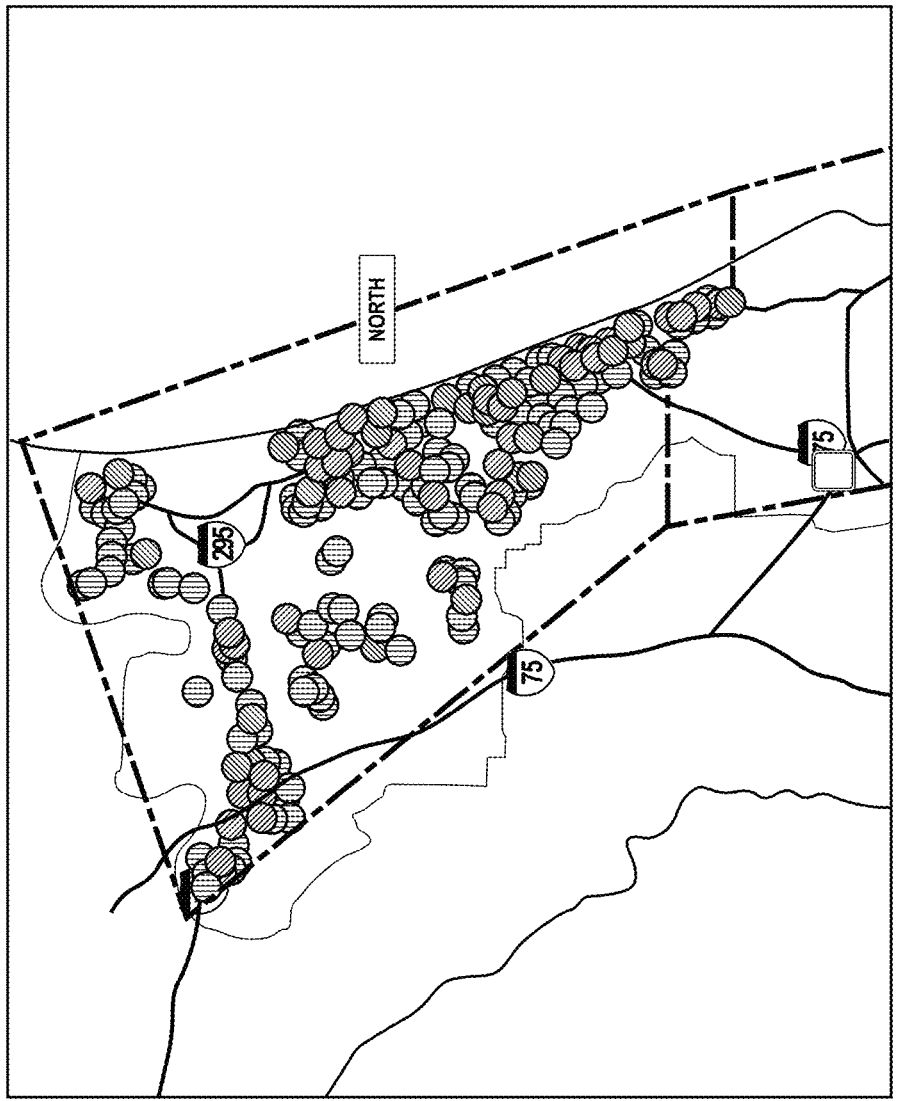
Figure 14:
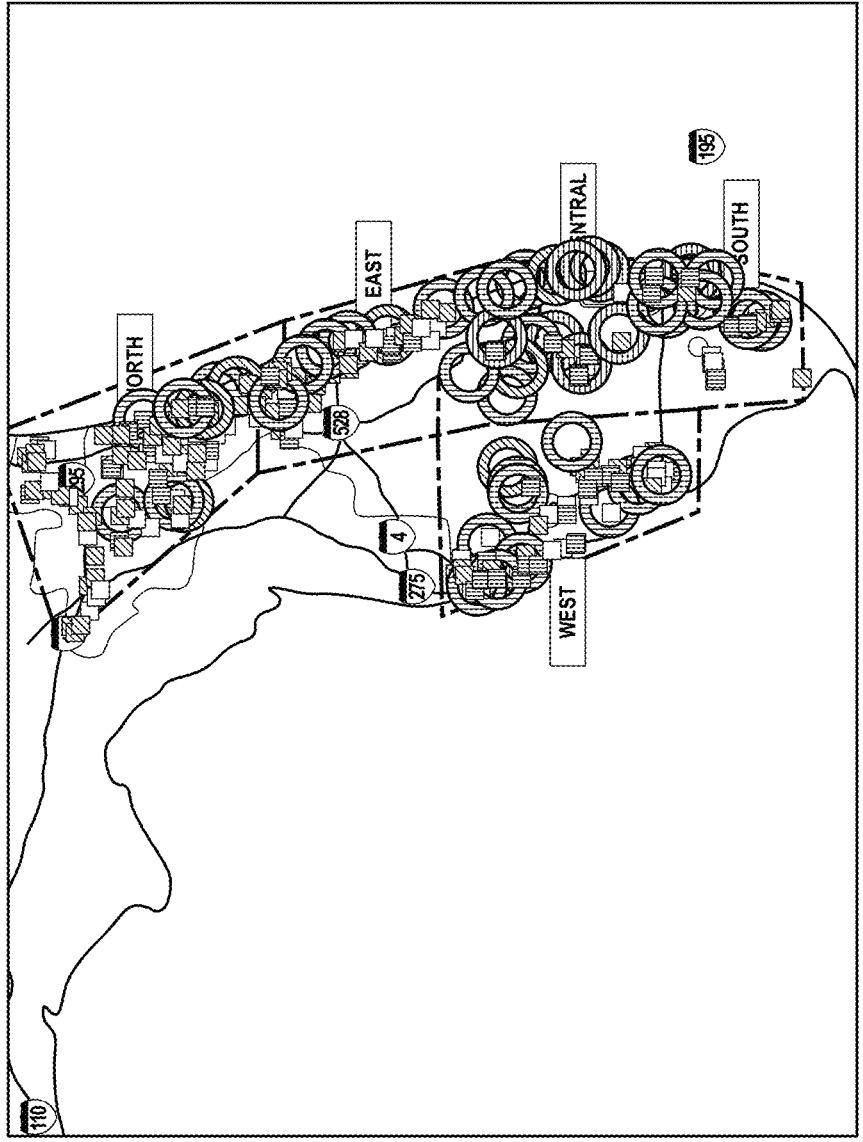

FIGS. 6 and 7 illustrate graphical displays of network health data in accordance with a system and method of aggregating and displaying network data. It is noted that the types of usage data and additional (geographic, historic, transaction, etc.) data employed to produce the output depicted in FIGS. 6 and 7 may vary as a function of the intended output and the actionable insight sought to be provided. As is evident from the drawing figures, myriad data may be analyzed and provided in conveniently readable formats.

In some applications, processing output may be employed to infer or otherwise to anticipate network failures or other adverse operating conditions before they occur. For instance, by observing usage and selectively identified additional data as set forth above, and in particular, how those data vary over time, it may be possible to predict that a service outage is propagating in a particular direction or into a particular region. It may be possible to bring more resources, such as additional substations or transformer clusters, on line to accommodate time-varying loads in order to prevent further spread of the outage. Similarly, active monitoring of data represented in FIGS. 6 and 7 may provide actionable insight that prompts a utility service provider to dispatch maintenance personnel to a location predicted to be affected by service or communications network failure or to shut down particular facilities (such as a substation) to limit a cascade failure of large portions of the utility grid. In that regard, a method of aggregating and displaying network data (such as illustrated at block 306 in FIG. 3) may optionally include predicting a network condition as a function of the processing, recommending or suggesting a course of action responsive to the predicting, or even automatically executing or effectuating certain preventative measures to minimize an effect of the predicted network condition.

In that regard, and referring to FIG. 6, access points, relays, and/or other network devices such as meters 150, 151 may be monitored, for example, either continuously, in real time, in near real time, or on a predetermined or selectively adjustable schedule. A disclosed system and method may run a command ping job, for instance, every 15 minutes (or at some other desired interval) to communicate to all, or perhaps a selected subset of, network devices. Communication responses from each device may then be evaluated such that a time series calculation may be performed to determine how long a particular device has not communicated. Based at least in part upon the evaluation outcome, a non-communicating device may be placed into certain or selected time parameter categories. A disclosed system and method may then execute automated "next processing" events (called "triggers") based upon results and the categorization of a device.

In the foregoing manner, a time series evaluation platform may be built for all network events tracked; this may allow network events to be tracked and categorized in event categories such as "threshold events," for instance. A trigger system may then, based upon a threshold event, create an appropriate or "next logical flow" ticket for internal evaluation and/or external ticket processing. Such a threshold and trigger management system may be fully integrated into STI server 290, for example, or may operate in cooperation with components or software instructions sets at systems 180. It may be possible in some instances to identify whether a failure is associated with a cellular network (FIG. 6), for example, where widespread communications failures are associated with a number of networked devices, or whether a failure is specific to a particular unreachable device or cluster of devices (FIG. 7).

The smart dashboard and data display illustrated in FIG. 6 is representative. It may be desirable that the display be refreshed with new data at a predetermined interval (every 30 minutes, for instance) that may be adjustable depending upon network conditions, natural disasters and other exigencies, etc. In the FIG. 6 implementation, a red halo or cloud icon or graphical representation may indicate access points that may be affected by cellular outage or other network service failure. In some instances, such a representation may be warranted where five or more access points on the same carrier or network service provider have been deemed unreachable for a particular duration (one hour, for instance); again, such a threshold duration may be selectively adjustable depending upon the circumstances. The smart dashboard and data display illustrated in FIG. 7 depicts similar data, but on a more granular level. In the FIG.

7 implementation, it may be desirable that the display be refreshed with new data at a longer interval, say 24 or 36 hours, though other intervals may be appropriate in certain situations. Icons in FIG. 7 may be used to depict clusters (such as 10 or more) of meters 150, 151 within a specified radius (such as, e.g., 1000 meters) that have not been read within a specified period. It will be appreciated that the data depicted in FIGS. 6 and 7, when monitored as set forth above, may provide usage data and other selectively identified data to enable processing operations (such as at block 303) to instantiate or otherwise to create a new actionable event or trigger.

FIGS. 8-14 illustrate graphical displays of optimization tools data in accordance with a system and method of aggregating and displaying network data. It will be appreciated that active monitoring of data such as are depicted in FIGS. 8-14 may inform a utility service provider regarding action items that may be taken to optimize network resources, for instance, responsive to changing conditions. Analysis of the manner in which last 5% meter read data (FIGS. 12-13) and access point load conditions (FIG. 14) change over time, for example, may enable a service provider to act responsive to changing conditions. For instance, a service provider may decide to implement rolling black outs or to divert power to additional or alternative substations, to implement load balancing algorithms for one or more network access points, or take other remedial or prophylactic measures to ensure that deleterious network conditions do not propagate. Those of skill in the art will appreciate that any number of actions may be advisable or desirable based upon results of the foregoing processing and display of usage data and associated information; these actions may generally be application-specific and customizable, depending upon the goals of the utility service provider, the nature and stability of the utility distribution grid and the quality of the communications network infrastructure, the processing capabilities of the meters (such as meters 150, 151) and other constituent elements of the network (such as AMI network 160), or a combination of these and a variety of other factors.

Regarding FIGS. 8-11, for instance, it is noted that a number of hops between a particular meter (such as particular meter 151) and a network access point may influence communications (i.e., the passing of data packets). When a communications path from a node (such as a meter 150, 151 or other networked device) to an access point uses a high number of hops, this "high hop count" may impact the speed and reliability of data packet transmission and data content reception, defining a success percentage. For example, where 1150 bites are transmitted, but only 1020 bites are received, that transmission may be considered 88.69% successful. In many AMI mesh networks, the chance of data in packets being lost increases when hop count equals or exceeds about 12 hops (accordingly, the FIG. 8 implementation may display meters 150, 151 with hops counts greater than 11). In some implementations, a system and method may track and monitor hop counts to identify or otherwise to recognize high hop exceptions (or a likelihood of such an exception) in order to perform remediation, e.g., to decrease the number of communication hops, either as a preventative measure or as a corrective measure to ensure or to increase data transmission success rates. Single path meters (FIGS. 10 and 11) may have no alternative path to network communications if a particular access point fails. Accordingly, the data depicted in FIG. 10 may provide actionable insight for a utility service provider, which may rearrange or add network resources, for example, as a mechanism to provide redundancy or fault tolerance.

Figure 15:
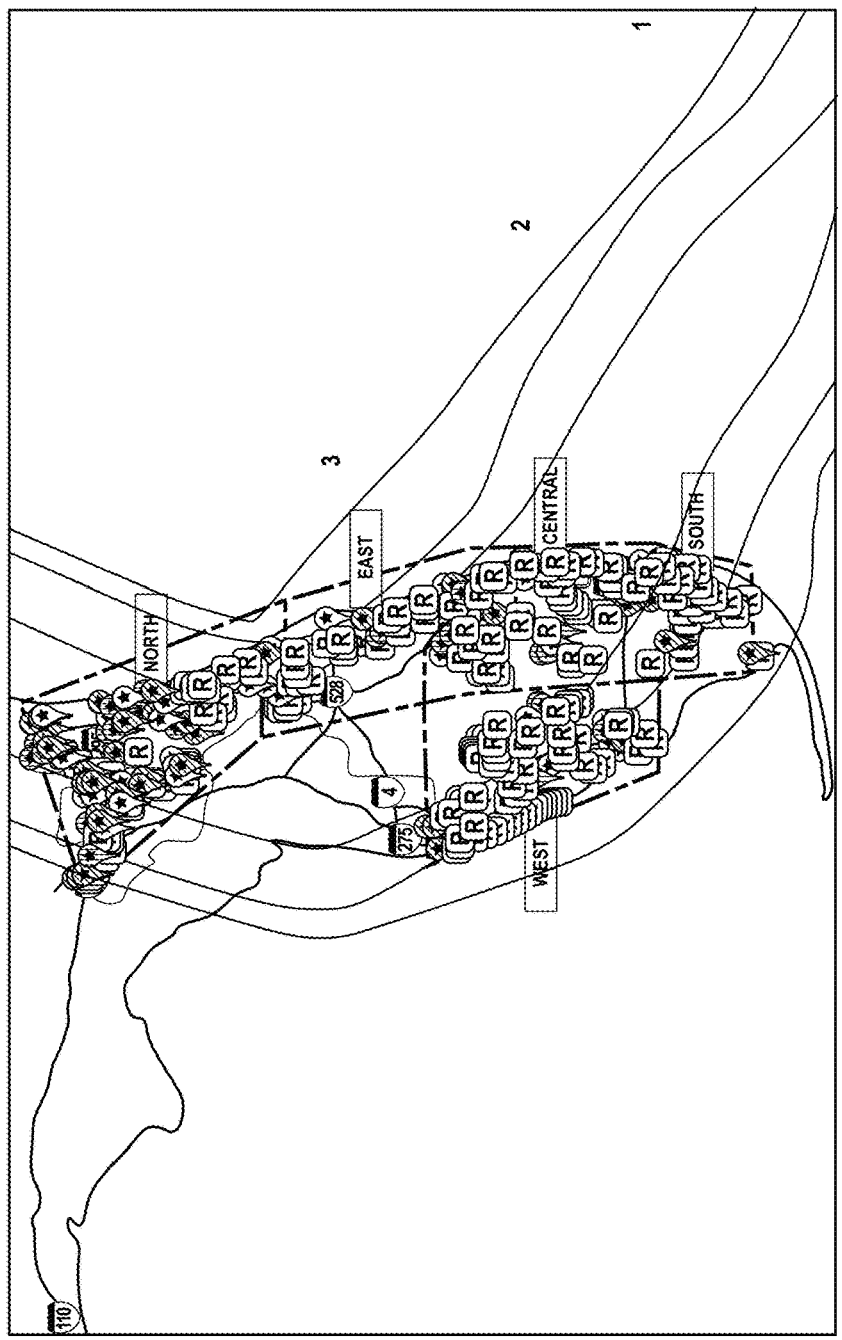

FIG. 15 illustrates a graphical display of restoration management data in accordance with a system and method of aggregating and displaying network data. The information displayed may be monitored over time to enable real time or near real time damage assessment or other network conditions caused by or attendant with an outage or partial failure of the utility distribution system or the communications network (such as AMI network 160). Again, monitoring or collecting usage data and associated information (such as geographical or historical data, or information related to a meteorological event or natural disaster, for example) may allow a utility service provider to anticipate or to predict network conditions that may result from an event or circumstance based upon past experience, and to deploy or to adjust resources based upon time varying or instantaneous data aggregated, processed, formatted, and displayed as set forth above. For instance, in the case where a past hurricane once caused wide-spread service outages in a series of locations in sequence, and another hurricane of similar intensity strikes in the same region or locality causing outages beginning and progressing in a similar sequential manner, the utility service provider may dispatch crews or take remedial action based upon where the outage is predicted to spread, based upon what is known of the previous event.

Knowledge of readable or "reachable" meters or other network hardware, unread meters, and additional event data such as expected wind velocities and location-based probabilities of equipment loss or destruction may enable a service provider to optimize resources both before an event as well as afterward. As indicated in FIG. 15, it may be desirable to update or refresh data in a smart dashboard display on a per storm (or other event) basis. Wind band categories, utility pole or other resource loss probabilities, and pre- and post-event data (from the previous storm or event) may be displayed for use by a processing system or system administrator. In some instances, as noted above, it my be desirable to generate maintenance calls, service instructions, or other actionable events or triggers, such as dispatching maintenance personnel to a particular location, responsive to these data.

Figure 16:
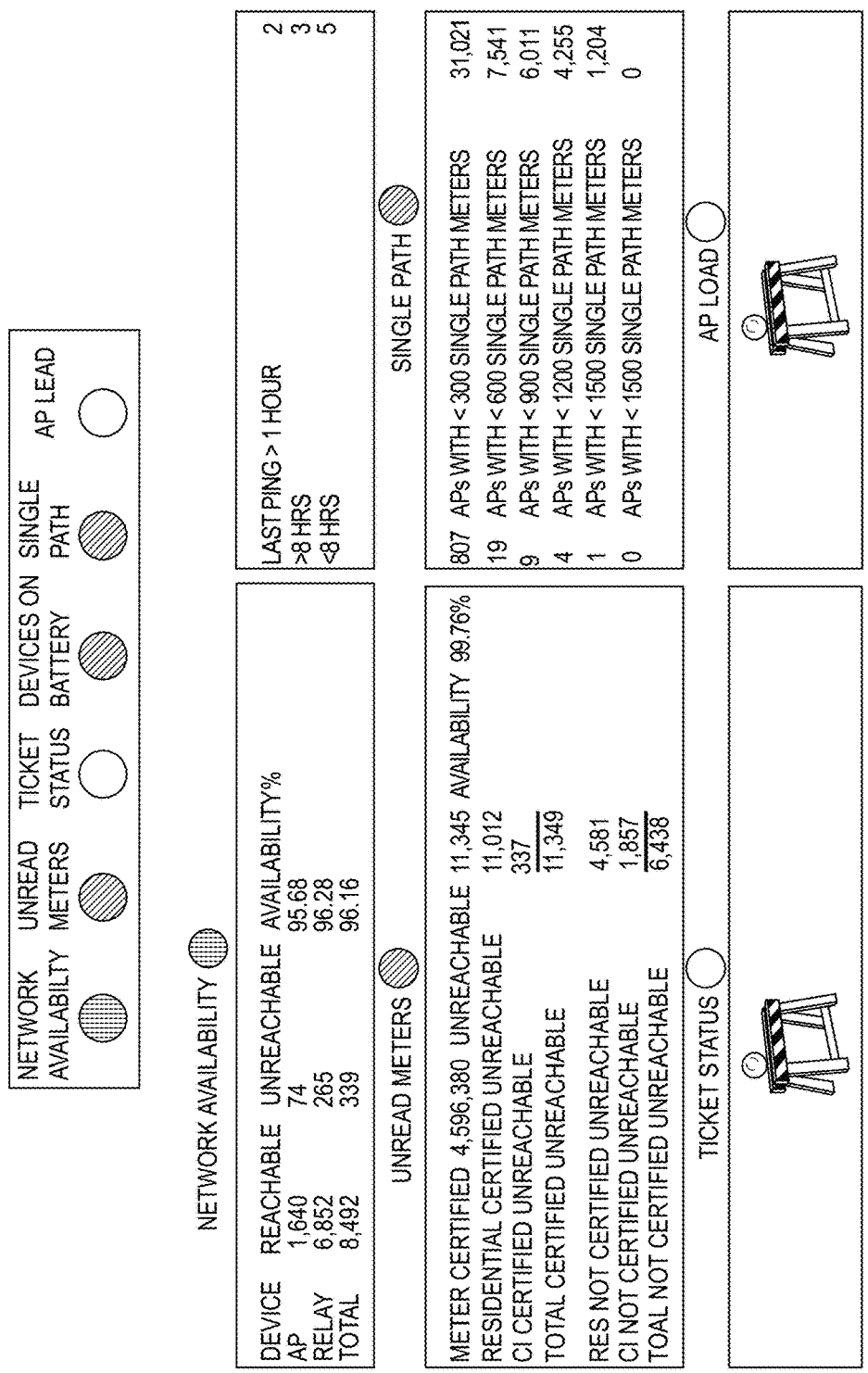

FIG. 16 illustrates a graphical display of network health summary data in accordance with a system and method of aggregating and displaying network data. The various icons representing usage data and other information illustrated in FIG. 16 may provide an "at a glance" summary of all (or a relevant portion of) impacting health check and optimization layer data available, and may be interactive or selectively activated, for instance, via interaction with a user interface. In particular, and as is generally known in the art of user interfaces, selection of a particular resource or category of data may trigger additional processing operations causing details concerning operation or historical data associated with the particular resource or category to be displayed. For example, selection of the "AP Load" category in the lower right corner of the FIG. 16 display may cause display of the usage data and associated information illustrated in FIG. 14.

Some of FIGS. 4-16 may employ certain terminology as follows:

"Near real time"—Close to real-time, for example, every five minutes, every minute, every ten minutes, etc. When a field ticket is created, assigned, completed, or closed, the status changes. The NOC tool updates the internal tracking of tickets or status changes. These updates may occur every five minutes in accordance with some routines.

"AP rollup"—A single path meter is a meter that can only communicate with one access point. The terminology of "rollup to an AP" means or refers to all the meters that can only communicate with one specific access point. For example, in a meter population of 1000 meters where there are three access points installed and 900 of the 100) meters can communicate with two of the access points, those 900 meters are known to have redundant communication paths. Single path meters—100 of the meters in this example—can only communicate with one access point (this is referred to as single path meter communication as noted above). Single path meter communication may not provide or allow for optimal performance in a communication network, and so the system and method described above may generally recognize all single path meters, with the goal of subsequently providing additional access points for these meters. Accordingly, new access points may be strategically placed in the areas where they may provide redundant communication paths in areas where they were previously lacking. This reduces risk in the event that an access point goes hard down, since the meters may communicate with an alternate access point.

"Last 5% meter reads according to no reads for 4 or more days, reappearance, and cluster size"—The Last 5% meter read terminology refers to the last (i.e., most recent) meters to be read or attempted to be read in the automated remote meter read jobs (such as those that may occur on a schedule or at a predetermined frequency, for example, six or eight times per day). A meter reading job generally takes about 1.5 hours; i.e., within that period of time, all meters within a portion of the network are read. The meters with which communication is most difficult, due to poor communications, for example, generally end up in the last 5% of meters that get read (or possibly go unread) during a specific read job. A system and method as set forth above may track these data for a duration, say over a four or six day period, for instance, to understand which meters tend to appear in the last 5% or are likely to be unreadable, and also which meters may be read some days but not on other days (reappearance). These data allow such meters to be grouped by cluster size (the number of meters within 1000 feet or 10,000 feet of each other, for example), and may provide a graphical or visual display identifying which meters may have, or are likely to have, communication problems; field remediation or software or firmware pushes may be employed to improve the network communication to these meters.

"APs according to associated meters on primary queue"—Access points ("APs") have multiple internal queues and/or lists of meters with which they communicate. The primary queue refers to the meters that have the best communication path with that access point. Secondary queues refer to alternative paths for meter communication. It may generally be useful to know how many meters are on the primary path of a specific access point due to the fact that access points generally have processing or computational limits. When limits are exceeded, an access point may not adequately support communication paths with all of its associated meters on the secondary queue, the primary queue, or both.

"Pingable network devices"—To validate that a network device (e.g., a meter, access point, or relay) is working, a utility service provider may transmit a wireless (such as a radio frequency, or "RF") data packet that requires a response from the device; in wired systems, a ping may be transmitted via wireline as is generally known. This is called a communication ping. A device that provides a response to a ping may generally be considered operable in some circumstances, and in any event is labeled as "pingable." For example, if a device is pinged to determine its status, and that device comes back with a communication responsive to the ping (indicative of a power on condition), it is considered "pingable" and ready for bi-directional data communications.

"Wind band categories"—These are wind bands (ribbons of wind velocity values, typically measured in miles per hour or knots) of storms, the data associated with which may come from NOAA ("National Oceanographic and Atmospheric Administration"). These data, when associated with a meteorological event, are used to categorize the intensity of the storm, for example, as a tropical depression, a tropical storm, a hurricane of category 1-5, and so forth.

"Pre-Event" and "Post-Event"—Pre-event may refer a tool designed to predict impact to a communication network before a storm hits a utility service territory or corridor. As set forth above, this functionality may be a feature of an event management application that employs data from other sources and forecasts storm restoration plans, including expected or anticipated effort and required resources, prior to a storm. Post-event may refer to a tool designed to manage remediation of a communication network after a storm has impacted a utility service territory or corridor. As described above, this functionality may also be a feature of the event management application that analyzes impacted network devices and lays out or suggests a restoration plan, including estimated resources required and predicted effort (such as man-hours), after the storm has passed.

The descriptions set forth above are meant to be illustrative and not limiting. Various modifications, in addition to those described herein, will be apparent to those skilled in the art from the foregoing description. Such modifications are also intended to fall within the scope of the concepts described herein. Each patent, patent application and publication cited or described in this document are hereby incorporated herein by reference, in their entireties.

The foregoing description of possible implementations consistent with the present disclosure does not represent a comprehensive list of all such implementations or all variations of the implementations described. The description of some implementation should not be construed as an intent to exclude other implementations. For example, artisans will understand how to implement the illustrative examples in many other ways, using equivalents and alternatives that do not depart from the scope of the disclosure. Moreover, unless indicated to the contrary in the preceding description, none of the components described in the implementations are essential to the arrangements disclosed. It is thus intended that the implementations be considered as illustrative, with a true scope and spirit of the disclosure being indicated by the following claims.

What is claimed is:
1. A method comprising:
    collecting metered utility usage data reported by plurality of meters monitoring a service provided through a metered utility distribution network;
    selectively identifying additional data, the additional data comprising:
    data associated with operation of delivering the service via the metered utility distribution network; and
    historical data comprising at least one of a meteorological event or a natural disaster;
    processing the metered utility usage data and the additional data to identify a problem related to operation of delivering the service via the metered utility distribution network;

predicting, based on the problem, a condition indicative of a failure of delivering the service via the metered utility distribution network as a function of the processing, and wherein the condition comprises a condition of the metered utility distribution network that is associated with the historical data;

determining formatting preferences associated with a display of an output indicative of the failure;

responsive to said processing and said determining and said predicting, transmitting the output and the formatting preferences; and effectuating a preventative measure to minimize an effect of the condition.

2. The method of claim 1 wherein said effectuating a preventative measure comprises dispatching resources to a location associated with the condition.

3. The method of claim 1, wherein the metered utility usage data comprises electrical power smart meter data.

4. The method of claim 1, wherein the condition comprises propagation of a service outage of the metered utility distribution network.

5. A system for analyzing a metered utility distribution network, said system comprising:

a network infrastructure operative to collect metered utility usage data reported by plurality of meters monitoring a service provided through a metered utility distribution network; and a server communicably coupled to said network infrastructure and operative to process the metered utility usage data and selectively identified additional data to identify a problem related to operation of delivering the service via the metered utility distribution network, wherein the additional data comprises historical data comprising at least one of a meteorological event or a natural disaster, and the server further operative to predict, based on the problem, an anticipated condition indicative of a failure of delivering the service via the metered utility distribution network as a function of the processing, and wherein the condition comprises a condition of the metered utility distribution network that is associated with the historical data;

said server comprising an application operative to produce an output indicative of the failure and a dashboard operative to determine formatting preferences associated with a display of the output;

wherein the server is further operative to transmit the output and the formatting preferences to a remote device; and wherein said application is further operative to effectuate a preventative measure to minimize an effect of the anticipated condition.

6. The system of claim 5 wherein said application is further operative to dispatch resources to a location associated with the anticipated condition.

7. A non-transitory computer-readable storage medium encoded with data and instructions comprising an application which, when executed on a processor, is configured to perform an operation comprising: selectively identifying additional data, the additional data comprising:

data associated with operation of delivering the service via the metered utility distribution network; and historical data comprising at least one of a meteorological event or a natural disaster;

processing the metered utility usage data and the additional data to identify a problem related to operation of delivering the service via the metered utility distribution network;

predicting, based on the problem, an anticipated condition indicative of a failure of delivering the service via the metered utility distribution network predicted as a function of the processing, and wherein the condition comprises a condition of the metered utility distribution network that is associated with the historical data;

determining formatting preferences associated with a display of an output indicative of the failure;

responsive to said processing and said determining, transmitting the output and the formatting preferences; and wherein the operation further comprises effectuating a preventative measure to minimize an effect of the anticipated condition.

* * * * *